United States Patent
Kobayashi

(10) Patent No.: US 8,236,707 B2
(45) Date of Patent: Aug. 7, 2012

(54) METHOD OF MANUFACTURING A SEMICONDUCTOR DEVICE

(75) Inventor: Kazuo Kobayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/882,746

(22) Filed: Sep. 15, 2010

(65) Prior Publication Data
US 2011/0207336 A1    Aug. 25, 2011

(30) Foreign Application Priority Data
Feb. 25, 2010    (JP) ................................. 2010-039627

(51) Int. Cl.
*H01L 21/31* (2006.01)
(52) U.S. Cl. ................. 438/770; 438/771; 257/E21.282
(58) Field of Classification Search .................. 438/770, 438/773, 771; 257/E21.284, E21.282
See application file for complete search history.

(56) References Cited

U.S. PATENT DOCUMENTS

| | | | | |
|---|---|---|---|---|
| 5,414,244 A * | 5/1995 | Imahashi | ....................... | 219/497 |
| 6,221,789 B1 * | 4/2001 | Arghavani et al. | ............ | 438/763 |
| 6,566,199 B2 * | 5/2003 | Tokai et al. | ................... | 438/261 |
| 6,706,572 B1 * | 3/2004 | Yamazaki et al. | ............ | 438/166 |
| 7,727,828 B2 * | 6/2010 | Chua et al. | .................... | 438/197 |
| 2007/0111450 A1 | 5/2007 | Sato et al. | | |
| 2010/0090227 A1 * | 4/2010 | Lou et al. | ........................ | 257/77 |

FOREIGN PATENT DOCUMENTS

| | | |
|---|---|---|
| JP | 10-284488 | 10/1998 |
| JP | 2001-110807 | 4/2001 |
| JP | 2001-230442 A | 8/2001 |
| JP | 2005-79430 | 3/2005 |
| JP | 2006-294928 | 10/2006 |
| KR | 10-2007-0051702 | 5/2007 |

OTHER PUBLICATIONS

Bailey et all., "Derivation of Rate Constants for the Batch Furnance Radical Oxidation of Silicon Wafers via Hydrogen Combustion," Journal of the Electrochemical Society, 156, H372-H377, 2009.*
Takuma Suzuki, et al. "SiC-MOSFET with High Channel Mobility and High Reliability", Toshiba Review, vol. 63, No. 10, 2008, pp. 39-43.
Korean Office Action mailed on May 29, 2012, issued for Korean Patent Application No. 10-2011-0013957 (with Partial English translation).

* cited by examiner

*Primary Examiner* — Julia Slutsker
(74) *Attorney, Agent, or Firm* — Oblon, Spivak, McClelland, Maier & Neustadt, L.L.P.

(57) ABSTRACT

A method of manufacturing a semiconductor device according to the present invention includes the steps of: (a) introducing hydrogen and oxygen on a SiC substrate; and (b) subjecting the hydrogen and the oxygen to a combustion reaction on the SiC substrate to form a gate oxide film being a silicon oxide film on a surface of the SiC substrate by the combustion reaction.

4 Claims, 4 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a method of providing a highly reliable oxide film whose interface state on an interface between a silicon carbide (SiC) substrate and an oxide film is reduced in an oxidation step on the SiC substrate.

2. Description of the Background Art

Silicon carbide (SiC) has a dielectric breakdown field strength higher by approximately one order than that of silicon (Si), which makes it possible to reduce a thickness of a drift layer thereof for keeping a breakdown voltage to one-tenth of a drift layer of Si. This enables a loss reduction in power devices.

However, between a silicon surface and a carbon surface of SiC, there are exhibited different physical properties on surfaces and interfaces due to differences in ionicity of crystal and bond sequence, and thus a difference occurs in thermal oxidation rate when oxidation is performed on the SiC substrate. Therefore, when forming a gate oxide film in a SiC-metal oxide semiconductor field-effect transistor (MOSFET), oxidation conditions need to be optimized depending on a crystal plane. This is because a difference in oxidation conditions considerably affects the mobility of an inversion channel and the reliability of an oxide film.

Conventional oxidation techniques are classified into two types including the dry oxidation technique of supplying only oxygen to form an oxide film, and the wet oxidation technique of burning oxygen and hydrogen in front of a reactor and supplying a water-vapor atmosphere thereof to the reactor to form an oxide film.

In the gate oxide film formed on the SiC substrate by the wet oxidation technique, hydrogen atoms in a water-vapor atmosphere effectively hydrogen-terminate dangling bond on the interface, which produces an effect of reducing an interface state. Accordingly, the inversion channel mobility of the MOSFET is improved. Further, in the wet oxidation technique, strong oxidation power tends to promote desorption of the residual carbon on the interface, to thereby reduce an interface state. For this reason, wet oxidation is desirably employed.

When the reliability of an oxide film by the wet oxidation technique is checked, however, the dielectric breakdown field strength is inferior to a gate oxide film formed by the dry oxidation technique due to a large amount of hydroxy groups (OH groups) contained in the gate oxide film.

Therefore, in "SiC-MOSFET with High Channel Mobility and High Reliability", Toshiba Review, Vol. 63, No. 10, 2008, it is devised that in forming a gate oxide film of a SiC-MOSFET, oxidation is performed by the dry oxidation technique, and then oxidation is performed again by the wet oxidation technique so as to achieve high mobility as well as high reliability.

However, in the method described in "SiC-MOSFET with High Channel Mobility and High Reliability", hydroxy groups are inevitably contained due to wet oxidation, which requires the method of forming a gate oxide film capable of achieving higher reliability.

SUMMARY OF THE INVENTION

An object of the present invention is therefore to provide a method of manufacturing a semiconductor device including a gate oxide film that has high reliability.

A method of manufacturing a semiconductor device according to the present invention includes the steps of (a) introducing hydrogen and oxygen on a SiC substrate; and (b) subjecting the hydrogen and the oxygen to a combustion reaction on the SiC substrate to form a silicon oxide film on a surface of the SiC substrate by the combustion reaction.

According to the method of manufacturing a semiconductor device of the present invention, it is possible to manufacture a semiconductor device including a gate oxide film that has high reliability.

These and other objects, features, aspects and advantages of the present invention will become more apparent from the following detailed description of the present invention when taken in conjunction with the accompanying drawings.

DESCRIPTION OF THE PREFERRED EMBODIMENT

A. First Preferred Embodiment

A-1. Manufacturing Method

Figure 1:
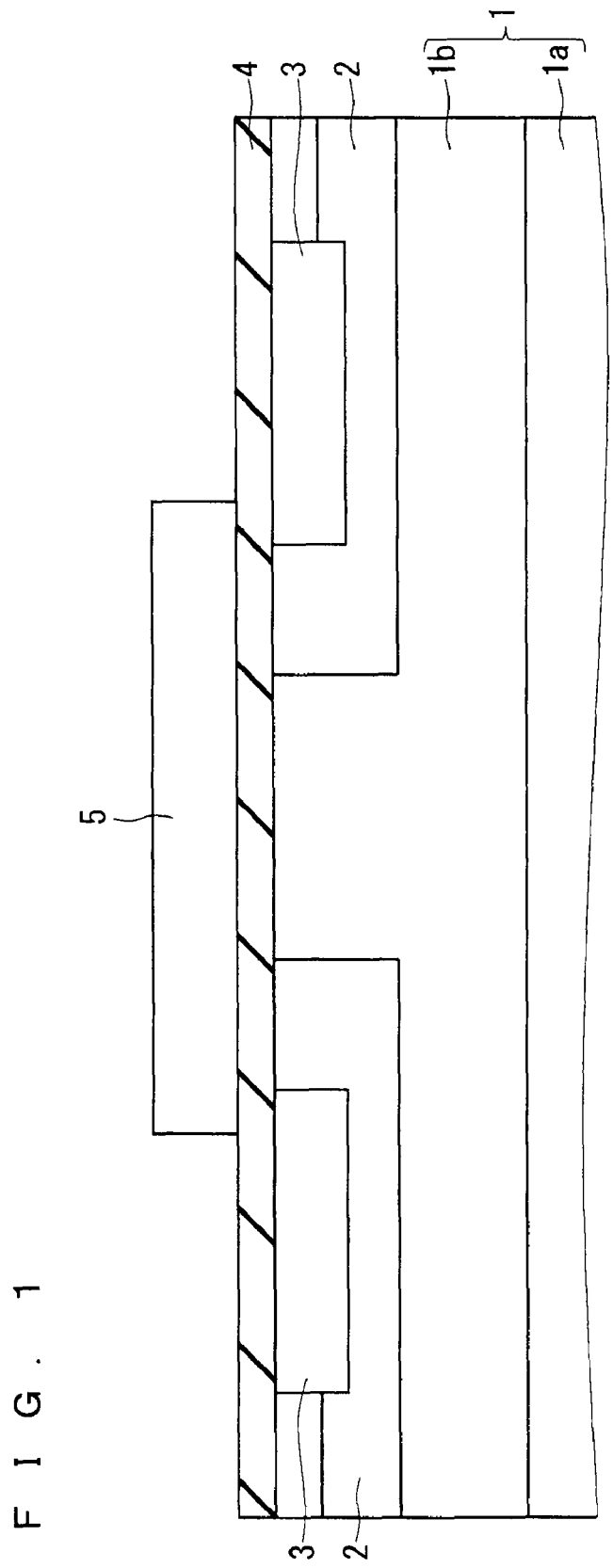
FIG. 1 is a cross-sectional view of a semiconductor device according to a first preferred embodiment.

FIG. 1 shows a cross-sectional structure of a SiC-MOSFET as a semiconductor device according to a first preferred embodiment. The SiC-MOSFET as shown in FIG. 1 is formed on a substrate in which a SiC epitaxial layer (drift layer) 1b is formed on a SiC substrate 1a. Hereinafter, the SiC substrate 1a and the SiC epitaxial layer 1b are collectively referred to as a SiC substrate 1. After patterning of a surface of the SiC substrate 1, Al is implanted, whereby p-type diffusion layers 2 are diffused apart from each other. Then, n-type SiC diffusion layers 3 are diffused on the p-type SiC diffusion layers 2 after patterning.

After that, a gate oxide film (silicon oxide film) 4 is formed on the SiC substrate 1 after the activation step of the diffusion layers by heat treatment, a poly-Si electrode 5 as a gate electrode is formed at a position sandwiched between the regions in which the p-type SiC diffusion layers 2 and the n-type SiC diffusion layers 3 are diffused.

The mobility and reliability of the gate oxide film 4 shown in FIG. 1 are deteriorated if a large number of defect states are created on an interface between the SiC substrate 1 and the gate oxide film 4.

There is conventionally employed wet oxidation in which hydrogen and oxygen are burned in advance and a water-vapor atmosphere generated as a result of burning is fed to a reactor for oxidation. Unfortunately, however, a large number of hydroxy groups are contained in the gate oxide film 4 that has been formed by wet oxidation, which deteriorates the mobility and reliability. Therefore, as another oxidation technique, the gate oxide film 4 is formed by immediately-above burning oxidation in the present invention. Herein, immediately-above burning oxidation refers to the oxidation technique in which hydrogen and oxygen are introduced above the substrate as such, and a combustion reaction is caused on the substrate to use an oxidation reaction accompanying the combustion reaction.

Figure 2:
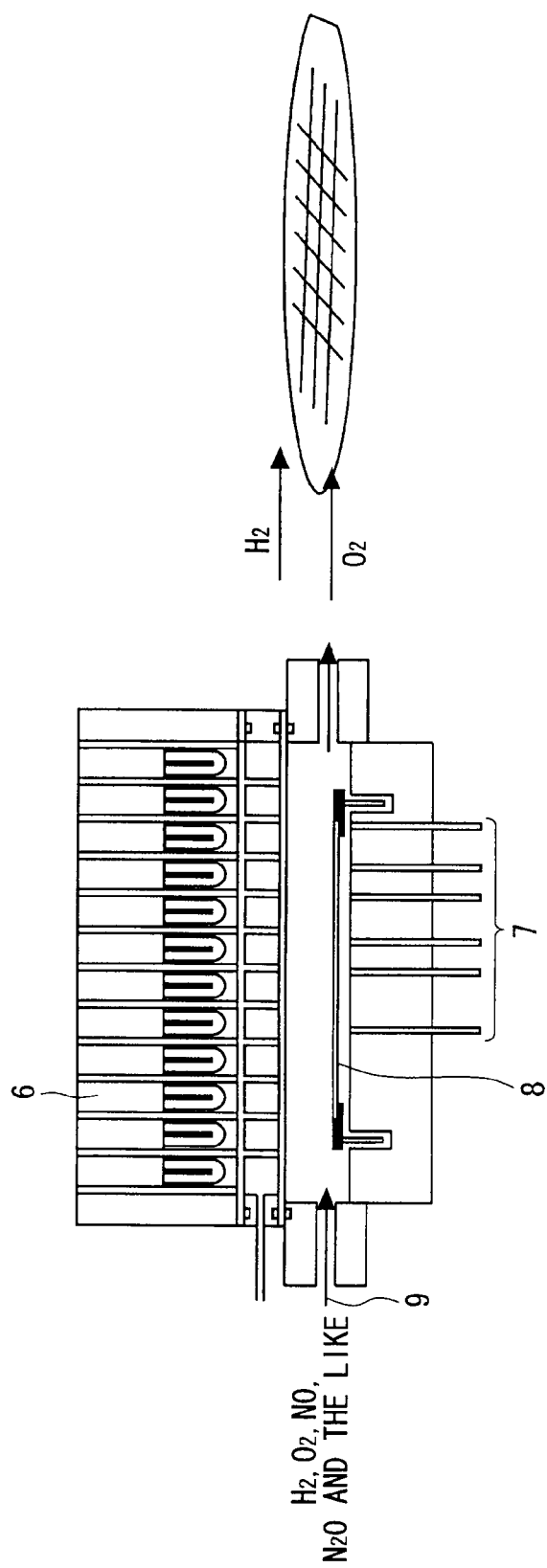
FIG. 2 shows an outline of a semiconductor manufacturing apparatus used in a method of manufacturing the semiconductor device according to the first preferred embodiment.

In order to perform immediately-above burning oxidation, a lamp irradiation single-wafer oxidation apparatus as shown in FIG. 2 (left part thereof) is used. In the lamp irradiation single-wafer oxidation apparatus shown in FIG. 2, halogen lamps 6 are provided in an upper portion of a chamber, the temperature of a back surface of a SiC substrate 8 is checked by radiation thermometers 7 in a lower portion of the chamber, and this temperature is fed back to a lamp power (not shown) to perform heating control.

Hydrogen gas and oxygen gas are introduced into a thermal atmosphere of 1,000° C. or higher under reduced pressure (of approximately 133 Pa) through a gas inlet 9. Then, in the state in which hydrogen gas and oxygen gas are introduced (right portion of FIG. 2), a combustion reaction ($2H_2+O_2\rightarrow 2H_2O$) is caused immediately above the SiC substrate 8 that has been selectively heated by the halogen lamps 6, to thereby perform thermal oxidation of SiC.

In the conventional wet oxidation, when hydrogen and oxygen are burned in a processing chamber of atmospheric pressure, quartz chips accompanying burning cause dusts. Therefore, a burning chamber is normally provided in front of a processing chamber, and hydrogen and oxygen are burned in the burning chamber in advance, with the result that a water-vapor atmosphere generated as a result of burning is fed to the processing chamber.

On the other hand, in immediately-above burning oxidation, the above-mentioned combustion reaction occurs immediately above the SiC substrate 8. The combustion reaction occurs immediately thereabove, and thus it is conceivable that radicals (such as O radicals) that are intermediate products of combustion reaction may dominantly contribute to oxidation. Therefore, the inventor(s) have found that hydroxy groups contained in a gate oxide film can be reduced, and desorption of carbon in SiC proceeds because radicals (such as O radicals) have higher oxidation power than $H_2O$, which enables the formation of a gate oxide film having higher reliability.

Further, as shown in FIG. 2 (left portion thereof), the radiation thermometers 7 are provided at six positions in a radial direction of the SiC substrate 8 on the back surface side of the SiC substrate 8, and thus temperature control is enabled among these 6 zones by rotating the SiC substrate 8. Accordingly, it is possible to keep in-plane uniformity of a film thickness to 1% or less in immediately-above burning oxidation (single-wafer mode), whereas in-plane uniformity of a film thickness is approximately 3% in wet oxidation (batch mode).

Note that a partial pressure of $H_2O$ is low in immediately-above burning oxidation. Further, the O radicals considered to contribute to oxidation are inactivated along with the growth of a gate oxide film, and accordingly are less likely to be diffused. That is, an oxidation rate decreases in the gate oxide film. As a result, it is possible to suppress thermal stress due to oxidation.

A gate oxide film is formed by immediately-above burning oxidation using this lamp irradiation single-wafer oxidation apparatus as described above, which makes it possible to manufacture a SiC-MOSFET having high mobility and reliability.

Note that NO gas and $N_2O$ gas are introduced into a lamp irradiation single-wafer oxidation apparatus for nitrogenizing an interface of the SiC substrate 8 to reduce interface defects.

A-2. Operation

Figure 3:
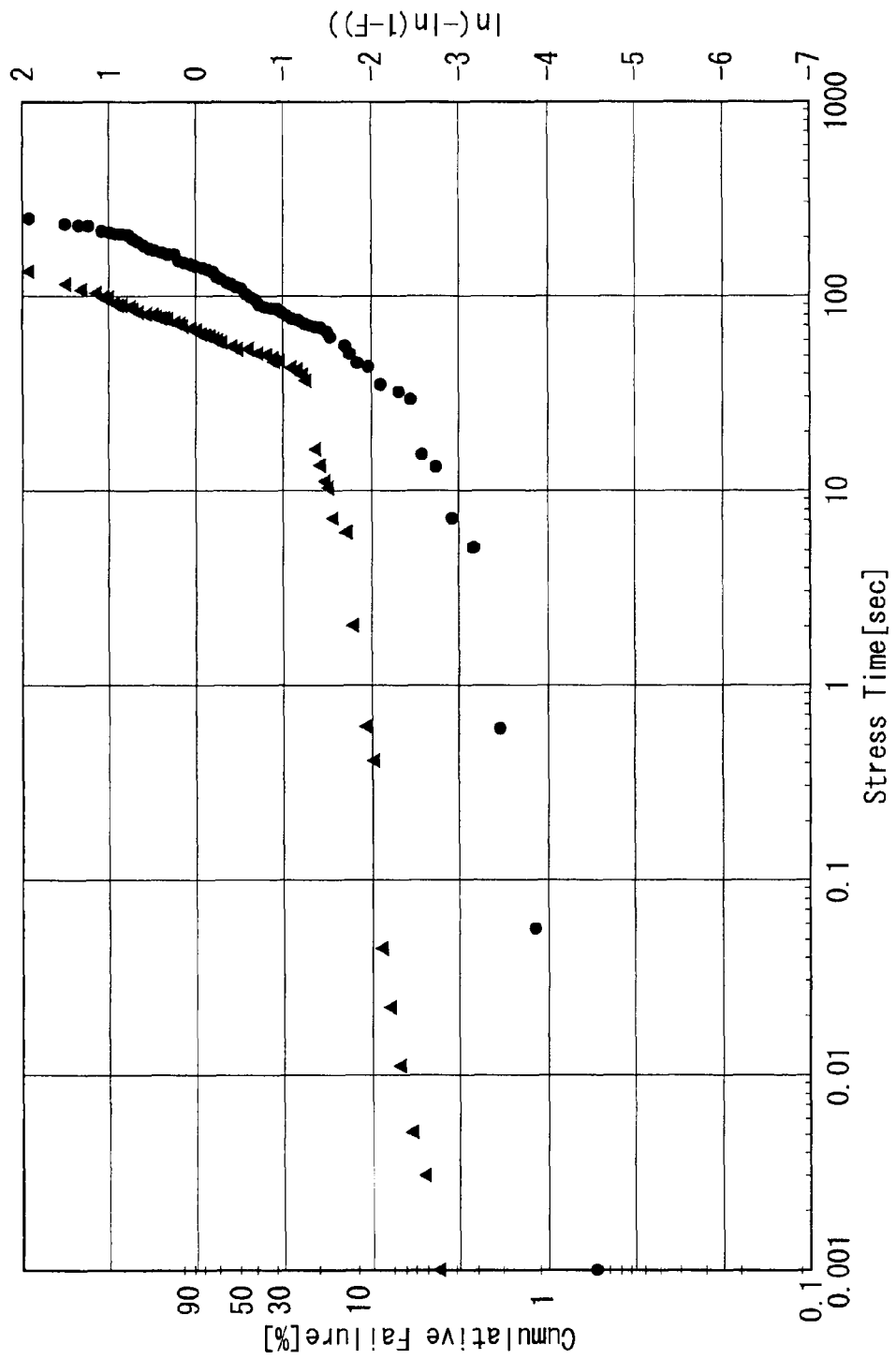
FIG. 3 shows comparison of reliability of a semiconductor device between immediately-above burning oxidation and wet oxidation.

FIG. 3 shows evaluation results of constant voltage stress-time dependent dielectric breakdown (CVS-TDDB) in a case of using a Si substrate. In the CVS-TDDB evaluation, changes over time of the number of semiconductor devices that have undergone dielectric breakdown are evaluated at a constant voltage. In FIG. 3, a vertical axis and a horizontal axis represent a failure rate and an elapsed time, respectively.

The evaluation results shown in FIG. 3 were obtained using a test element group (TEG) produced by forming two types of oxide films, an oxide film (having a film thickness of 7.2 nm) formed by immediately-above burning oxidation (single-wafer mode) and an oxide film (having a film thickness of 7.2 nm) formed by wet oxidation (batch mode), on an isolation base for shallow trench isolation (STI), further forming a poly-Si electrode, and performing patterning and back surface polishing. Specifically, a failure rate (10-sec failure rate) after application of 11-MV/cm stress (10 mA evaluation) for 10 seconds was evaluated at a temperature of 125° C.

As shown in FIG. 3, a 10-sec failure rate is 19.8% in wet oxidation (indicated by triangular dots in FIG. 3) that is conventionally performed, whereas in immediately-above burning oxidation (indicated by dots in FIG. 3), a 10-sec failure rate is 5.2%, which is lower than that of wet oxidation. This means that also in the elapsed time reaching dielectric breakdown, immediately-above burning oxidation outperforms wet oxidation. The above reveals that an oxide film having higher reliability is formed in immediately-above burning oxidation compared with wet oxidation.

In immediately-above burning oxidation, O radicals considered to dominantly contribute to oxidation are inactivated in the oxide film as the oxide film grows and are less likely to be diffused in the oxide film, which reduces an oxidation rate. In particular, an oxidation rate of SiC is smaller compared with Si, and thus it is difficult to form a thick gate oxide film (of approximately 100 nm) such as a gate oxide film for a power device. Further, immediately-above burning oxidation in this preferred embodiment is performed by a single-wafer oxidation apparatus, and thus heat is concentrated on the SiC substrate, which causes damage to a SiC substrate as a result of the treatment for a long time. Therefore, it is desired that the gate oxide film be formed on a SiC substrate by immediately-above burning oxidation to be 20 nm or less.

Figure 4:
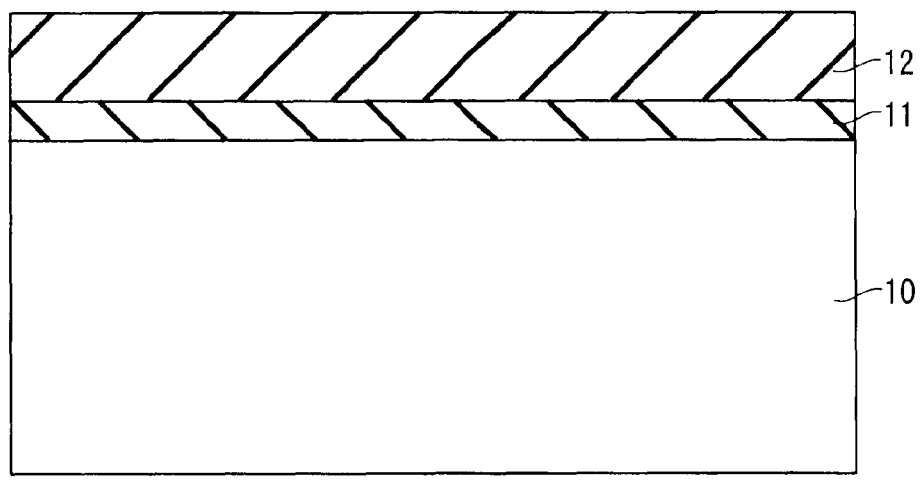
FIG. 4 is a cross-sectional view of another semiconductor device according to the first preferred embodiment.

As a measure taken against this, a gate oxide film 11 is formed to be 20 nm or less by immediately-above burning oxidation, and then dry oxidation in an atmosphere of only oxygen is performed to further form a gate oxide film 12, whereby a gate oxide film is formed to be thick, 100 nm or more in total (see FIG. 4). In this case, in performing dry oxidation, the gate oxide film 11 has been formed to be approximately 20 nm or less on a SiC substrate 10 by immediately-above burning oxidation. Thus, even in a case where the film formation is performed for a remaining thickness by dry oxidation, interface state density does not increase, which is a drawback of dry oxidation. Note that also in a case where the above-mentioned order is reversed such that a gate oxide film is formed by dry oxidation and then another gate oxide film is formed by immediately-above burning oxidation, the effect of enhancing reliability of a gate oxide film is achieved.

Figure 5:
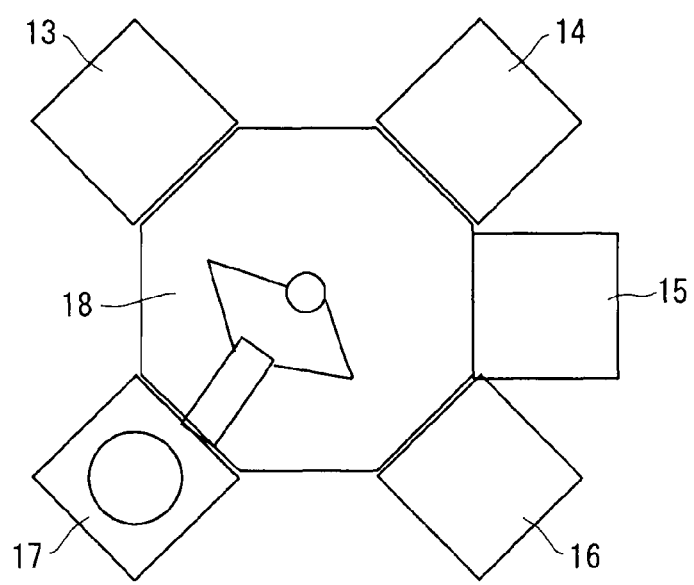
FIG. 5 shows an outline of a semiconductor manufacturing apparatus used in a method of manufacturing the another semiconductor device according to the first preferred embodiment.

Note that in a case where a gate oxide film is additionally formed by the above-mentioned method, an apparatus as shown in FIG. 5 can be used. In this apparatus, an immediately-above burning oxidation processing chamber 13, a dry oxidation processing chamber 14, an HTO furnace 15, load-lock chambers 16 and 17 are connected through a transport chamber 18, and immediately-above burning oxidation and dry oxidation can be performed while keeping insides of the processing chambers vacuum without causing them open to the atmosphere. That is, with the use of an apparatus that has the structure enabling step shift without exposing a SiC substrate to the ambient atmosphere, cleanliness is maintained, whereby it is possible to form a gate oxide film having high reliability in which foreign matters are prevented from being contained and an organic oxide film is not provided.

Further, though not shown, it is possible to form a gate oxide film to be thick in total by forming a gate oxide film by immediately-above burning oxidation, and then forming an oxide film by CVD to form another gate oxide film.

A-3. Effects

According to the first preferred embodiment of the present invention, the method of manufacturing a semiconductor device includes the steps of: (a) introducing hydrogen and oxygen on a SiC substrate 1; and (b) subjecting the hydrogen and the oxygen to a combustion reaction on the SiC substrate 1 to form a gate oxide film 4 being a silicon oxide film on a surface of the SiC substrate 1 by the combustion reaction. Accordingly, it is possible to manufacture a semiconductor device including a gate oxide film having high reliability.

Further, according to the first preferred embodiment of the present invention, in the method of manufacturing a semiconductor device, the steps (a) and (b) are performed with a lamp irradiation single-wafer oxidation apparatus forming, on the SiC substrate 1, a high-temperature atmosphere of a higher temperature compared with an ambient temperature by irradiating the SiC substrate 1 with light. Accordingly, it is possible to manufacture a semiconductor device including a highly reliable gate oxide film whose processing time is reduced.

Further, according to the first preferred embodiment of the present invention, the method of manufacturing a semiconductor device further includes the step of (c) dry-oxidizing the surface of the SiC substrate 1 to separately form a gate oxide film 12 being a silicon oxide film. Accordingly, it is possible to form a thick gate oxide film of approximately 100 nm, which enables manufacturing of a semiconductor device for a power device that requires a gate oxide film having the above-mentioned thickness. In particular, an oxidation rate of SiC is smaller than that of Si and thus is suitable for a case of forming a gate oxide film for a power device.

Further, according to the first preferred embodiment of the present invention, in the method of manufacturing a semiconductor device, the step (c) is performed after the step (b). This prevents an increase in interface state density due to dry oxidation because the gate oxide film 11 has been formed by immediately-above burning oxidation.

Further, according to the first preferred embodiment of the present invention, the method of manufacturing a semiconductor device further includes the step of (c) forming an oxide film on the surface of the SiC substrate 1 by CVD to separately form another silicon oxide film after the step (b). Accordingly, it is possible to form a thick gate oxide film of approximately 100 nm, which enables manufacturing of a semiconductor device for a power device that requires a gate oxide film having the above-mentioned thickness.

Further, according to the first preferred embodiment of the present invention, in the method of manufacturing a semiconductor device, the steps (a), (b) and (c) are performed with an apparatus having the structure enabling step shift without exposing the SiC substrate to an ambient atmosphere. Accordingly, it is possible to form a highly reliable gate oxide film in which foreign matters are prevented from being contained and an organic oxide film is not provided, which enables manufacturing of a semiconductor device having high mobility and reliability.

Further, according to the first preferred embodiment of the present invention, in a method of manufacturing a semiconductor device, when forming a gate oxide film of 100 nm or more on the SiC substrate 1 using the above-mentioned method of manufacturing a semiconductor device: the silicon oxide film of 20 nm or less is formed as the gate oxide film in the step (b); and the silicon oxide film of a remaining film thickness is formed as the gate oxide film in the step (c). Accordingly, it is possible to use the method of forming the gate oxide film of 20 nm or less that is the thickness enabling the formation by immediately-above burning oxidation whose oxidation rate is small, and filling a remaining thickness of 100 nm by forming the gate oxide film by dry oxidation or CVD. This enables manufacturing of a semiconductor device for a power device that requires a gate oxide film having the above-mentioned thickness.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) introducing hydrogen and oxygen on a SiC substrate;
   (b) subjecting said hydrogen and said oxygen to a combustion reaction on said SiC substrate to form a silicon oxide film on a surface of said SiC substrate by said combustion reaction; and
   (c) dry-oxidizing said surface of said SiC substrate to separately form another silicon oxide film,
   wherein the silicon oxide film formed step (b) is in direct contact with the another silicon oxide film formed in step (c), and
   said step (c) is performed after said step (b).

2. The method of manufacturing a semiconductor device according to claim 1, wherein said steps (a) and (b) are performed with a lamp irradiation single-wafer oxidation apparatus forming, on said SiC substrate, a high-temperature atmosphere of a higher temperature compared with an ambient temperature by irradiating said SiC substrate with light.

3. The method of manufacturing a semiconductor device according to claim 1, wherein said steps (a), (b) and (c) are performed with an apparatus having a structure enabling step shift without exposing said SiC substrate to an ambient atmosphere.

4. A method of manufacturing a semiconductor device, comprising the steps of:
   (a) introducing hydrogen and oxygen on a SiC substrate;
   (b) subjecting said hydrogen and said oxygen to a combustion reaction on said SiC substrate to form a silicon oxide film on a surface of said SiC substrate by said combustion reaction; and
   (c) dry-oxidizing said surface of said SiC substrate to separately form another silicon oxide film,
   wherein the silicon oxide film formed step (b) is in direct contact with the another silicon oxide film formed in step (c), and
   said steps (b) and (c) further include forming a gate oxide film of 100 nm or more on said SiC substrate, said silicon oxide film of 20 nm or less is formed as said gate oxide film in said step (b) and said another silicon oxide film of 80 nm or more is formed as said gate oxide film in said step (c).

* * * * *